United States Patent [19]

Mitzner et al.

[11] Patent Number: 5,432,457
[45] Date of Patent: Jul. 11, 1995

[54] CAPACITIVE DISK PROBE

[75] Inventors: Kenneth M. Mitzner, Torrance; Darin S. Hunzeker, Mission Viejo; William Hant, Los Angeles; Silvan S. Locus, Van Nuys; John C. Bryant, Los Alamitos, all of Calif.

[73] Assignee: Northrop Grumman Corporation, Los Angeles, Calif.

[21] Appl. No.: 188,283

[22] Filed: Jan. 28, 1994

[51] Int. Cl.[6] .................... G01R 27/26; G01R 31/08
[52] U.S. Cl. .................... 324/690; 324/519; 324/530; 324/686; 324/724
[58] Field of Search .................... 324/512, 519, 527, 528, 324/530, 534, 663, 672, 679, 686, 687, 690, 693, 705, 722, 724

[56] References Cited

U.S. PATENT DOCUMENTS

| | | | |
|---|---|---|---|
| 2,750,562 | 6/1956 | Starr | 324/528 |
| 3,400,331 | 9/1968 | Harris | 324/671 |
| 3,826,980 | 7/1974 | Deichelmann et al. | 324/663 |
| 4,075,557 | 2/1978 | Jurca | 324/719 |
| 4,103,226 | 7/1978 | Fromson et al. | 324/671 |
| 4,446,424 | 5/1984 | Chatanier et al. | 324/713 |
| 4,476,430 | 10/1984 | Wright et al. | 324/671 |
| 4,482,860 | 11/1984 | Risko | 324/671 |
| 4,565,966 | 1/1986 | Burr et al. | 324/519 |
| 4,914,421 | 4/1990 | Costemore d'Arc et al. | 340/568 |
| 4,996,492 | 2/1991 | Anderson et al. | 324/687 |
| 5,077,522 | 12/1991 | Lahitte et al. | 324/690 X |
| 5,309,110 | 5/1994 | O'Neill et al. | 324/663 X |

Primary Examiner—Kenneth A. Wieder
Assistant Examiner—Glenn W. Brown
Attorney, Agent, or Firm—Terry J. Anderson; Karl J. Hoch, Jr.

[57] ABSTRACT

A probe for measurement of an electrically conductive surface covered by an insulating cover layer has a pair of electrically conductive pads for capacitive coupling to the conductive surface. The pads may be formed by photolithography as part of a disk of a metallic layer disposed on a substrate of low dielectric material such as fibrous glass in an epoxy binder, the pads being separated by a relatively narrow gap. Included within the probe is an electrically insulating holder for supporting the substrate and the pads, the holder being configured to facilitate manual manipulation of the probe. The probe connects with a signal analyzer which provides a test signal coupled to the pads via a coaxial transmission line. During a sliding of the pads along the cover layer, electrical characteristics of a signal coupled capacitively via the pads to the conductive surface are analyzed by the analyzer to provide information on electrical continuity and resistivity of the surface.

12 Claims, 5 Drawing Sheets

000
CAPACITIVE DISK PROBE

GOVERNMENT LICENSE RIGHTS

The U.S. Government has a paid-up license in this invention and the right in limited circumstances to require the patent owner to license others on reasonable terms as provided for by the terms of contract number F33657-81-C-0067 awarded by the United States Air Force.

BACKGROUND OF THE INVENTION

This invention relates to probes for sensing continuity and resistivity of an electrically conductive surface and, more particularly, to a probe for testing an electrically conductive surface disposed behind an electrically insulating cover layer, the probe having an electrically conductive disk of two separate sections to be moved along the cover layer for capacitive coupling through the cover layer to the conductive layer, the probe being connected to a signal analyzer for sensing continuity of the conductive surface.

Probes have been employed to measure continuity of an electrically conductive surface so as to obtain a surface resistivity measurement. One form of such a probe is known as a four-point probe. Such a probe is useful in a situation wherein the probe can make direct electrical contact with the surface to be measured.

A problem arises in a situation wherein the electrically conductive surface to be measured is covered by an insulating layer which prevents direct electrical connection between the probe and the surface. In such a situation, the foregoing form of probe would be inoperative.

SUMMARY OF THE INVENTION

The aforementioned problem is overcome and other advantages are provided by a probe for sensing the electrical conductivity of an electrically conductive surface disposed beneath a cover layer wherein, in accordance with the invention, the probe has a planar disk divided in two sections each of which is an electrically conductive pad. The pads are separated by a relatively narrow gap. The pads are held in an insulating support, and are connected electrically by a coaxial transmission line to a signal analyzer. In use, the pads are placed against the cover layer and are slid along the cover. A test signal is provided by the analyzer, and is transmitted capacitively via the pads and through the cover layer to the conductive surface, the conductive surface completing the path of signal transmission. Any discontinuity in the electrical properties of the conductive surface are manifested by a change in the electrical signal reflected by the probe back to the analyzer. The probe is calibrated first by passage over a plurality of known covered conductive surfaces so as to obtain an average reference reading for the analyzer. Then, during testing of an unknown surface, comparisons with the reference reading serve as a measure of conductivity or resistivity, and an indication of continuity. Deviations from the reference reading are indicative of a break in continuity. The gap between the pads may be oriented in different directions to obtain an indication of the orientation of a defect, such as a crack, in the surface under test.

BRIEF DESCRIPTION OF THE DRAWING

The aforementioned aspects and other features of the invention are explained in the following description, taken in connection with the accompanying drawing wherein.

DETAILED DESCRIPTION

Figure 1:
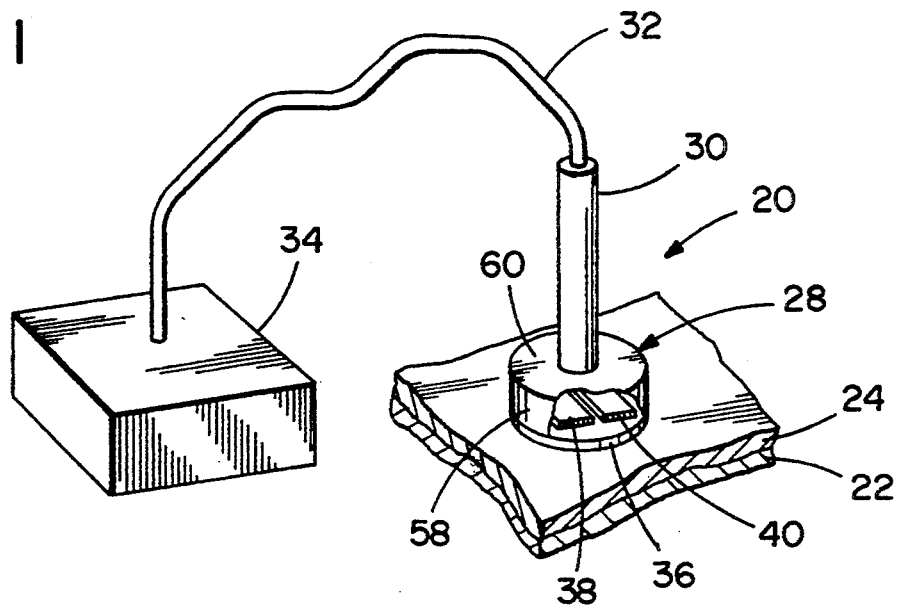
FIG. 1 shows a stylized perspective view of a probe of the invention passing along a covered electrically conductive surface for measurement of electrical characteristics of the surface, the probe being partially cut away to show interior electrical pads.
Figure 2:
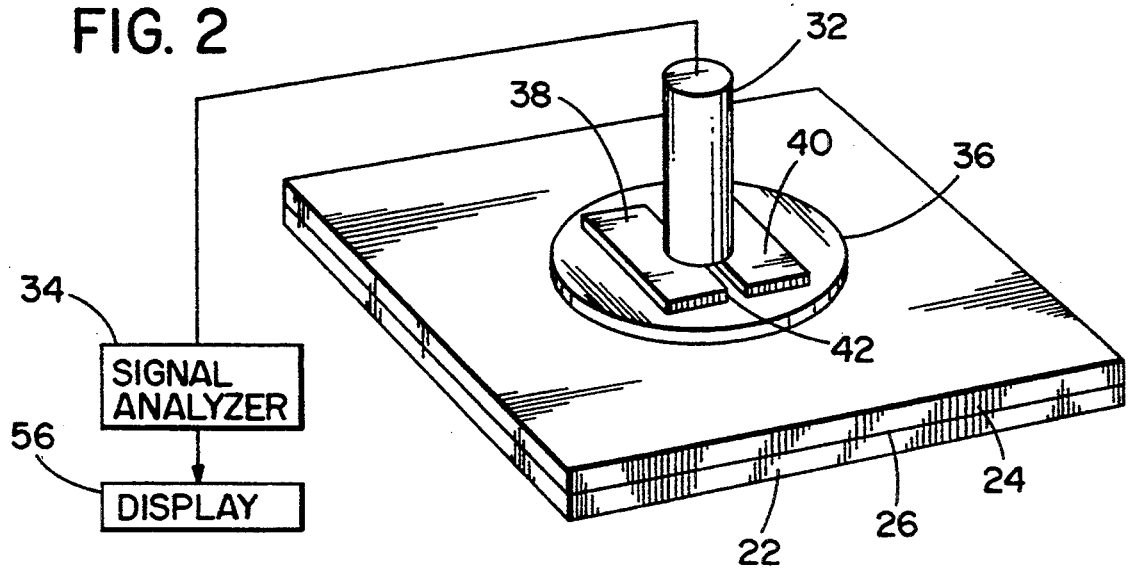
FIG. 2 is a schematic view of the probe of FIG. 1.
Figure 3:
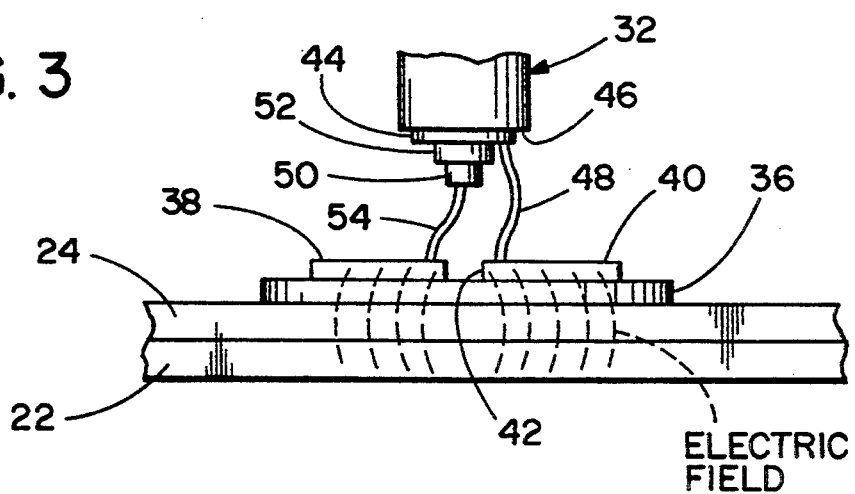
FIG. 3 is a schematic fragmentary side view of the probe of FIG. 1 in contact with the covered surface.

With reference to FIGS. 1-3, there is shown a probe 20 constructed in accordance with the invention for measuring electrical continuity and/or conductance of an electrically conductive sheet or layer 22. For example, material of the conductive layer 22 may be a metallic sheet, a metallic mesh, a cloth woven with a blend of metallic fibers and nonmetallic fibers such as fibrous glass, or a plastic sheet embedded with carbon particles, as well as other types of electrically conductive material. A cover layer 24 lies on a front surface 26 of the conductive layer 22 for protecting the conductive layer 22 from the environment. The cover layer 24 is constructed of an electrically insulating material such as a plastic, by way of example, generally having a relatively low dielectric constant. The probe 20 has a head 28 and an elongated handle 30 upstanding from the head 28, the head 28 extending transversely of the handle 30. In use, the head 28 is placed on the cover layer 24, and the probe 20 is slid along the cover layer 24 by manually grasping the handle 30. A coaxial cable 32 exits the handle 30 to connect the probe 20 with a signal analyzer 34. The analyzer 34 transmits an electrical signal to the probe 20, via the cable 32, and compares the signal to a signal reflected back from the probe 20 to the analyzer 34, thereby to measure the electrical characteristics of the conductive layer 22.

Figure 8:
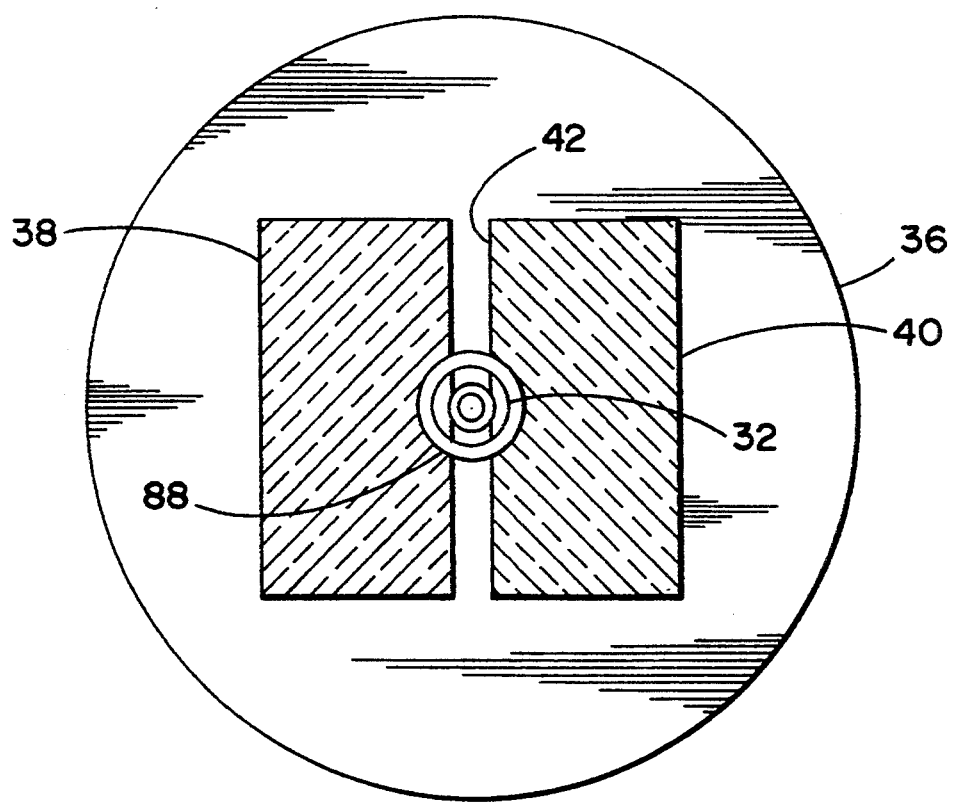
FIG. 8 is a sectional view, shown diagrammatically, of the central portion of the probe head taken along the line 8—8 in FIG. 6.

In accordance with the invention, the head 28 comprises a base 36 having a flat pancake shape and being formed of a rigid dielectric material such as fibrous glass embedded in epoxy. The head 28 includes two electrically conductive pads 38 and 40 (shown also in FIG. 8) disposed on a top surface of the base 36 and formed preferably of metallic film such as copper film by a photolithographic process. The pads 38 and 40 are spaced apart by a relatively narrow gap 42 which enables the pads 38 and 40 to function as the plates of a capacitor, thereby to provide capacitive coupling through the base 36 and the cover layer 24 to the conductive layer 22. The coaxial cable 32 has an outer conductor 44 enclosed by an insulating jacket 46 and making electrical connection with the pad 40 via a lead 48. The coaxial cable 32 further comprises an inner conductor 50 insulated from the outer conductor 44 by an electrically insulating sleeve 52 and making electrical connection with the pad 38 via a lead 54.

The capacitive coupling between the pads 38 and 40 is demonstrated in FIG. 3 by a schematic representation of the electric field lines directed between the pad 40 and the conductive layer 22, and between the pad 38 and the conductive layer 22. The gap 42 in cooperation with the base 36 and the cover layer 24 electrically insulate the pads 38 and 40 from each other. The parallel orientation of the pads 38 and 40 relative to the conductive layer 22 provides for the structure of a capacitor wherein the pad 38 and the layer 22 function as one capacitor, and the pad 40 and the layer 22 function as a second capacitor in series with the first capacitor. The coaxial cable 32 serves as a transmission line which, in a preferred embodiment of the invention, has an impedance of 50 ohms for propagating a test signal provided by the analyzer 34. The test signal has a carrier frequency in a range of 100–300 MHz (megahertz), in a preferred embodiment of the invention. The aforementioned series connection of the two capacitors constitutes a termination of the transmission line, and acts to reflect a test signal, transmitted by the analyzer 34, back to the analyzer 34. Typically, the carrier of the test signal is modulated with an amplitude or phase modulation, such as a pulse modulation, to facilitate a comparison of the reflected signal with the transmitted signal, thereby to attain, in a well-known manner, the reflection coefficient of the termination of the transmission line.

Further, in accordance with the invention, the reflection coefficient is dependent on the nature of the conductive layer 22. In the case portrayed in FIG. 3, wherein the layer is a continuous sheet of metal, the termination of the transmission line is substantially that of a capacitor with the result that the reflection coefficient, represented mathematically as a complex number, is essentially imaginary with an argument of 90 degrees. Such a result is obtained readily by the use of the well-known Smith chart implemented automatically by a computer within the analyzer 34. Such analyzers are readily available commercially. In the event that the metallic sheet of the layer 22 is replaced, by way of example, with a plastic material having carbon particles embedded therein, then the reflection coefficient has both real and imaginary components. Thereby, the analyzer 34 can output data, such as data of the aforementioned reflection coefficient, which varies in accordance with the nature of the conductive layer 22 so as to serve as an indication of continuity of the layer 22 and a measure of the electrical characteristics of the material of the layer 22. This information is outputted by the analyzer 34 on some form of a display 56 which may be, by way of example, a CRT (cathode ray tube) or recording tape, by way of example, and may include means for storing results of the testing of the conductive layer 22.

By way of further example in a possible outcome of the foregoing test, it is possible that the layer 22 is broken, as by means of a fracture located between the pads 38 and 40 and oriented parallel to the gap 42. In such a case, there would be little or no signal communicated via the capacitors represented by the pads 38 and 40 and the layer 22. In this case, the termination of the transmission line takes the form of a relatively large, substantially resistive load. In contrast, if the aforementioned fracture line were oriented perpendicularly to the slot 42, there would be little or no effect on the measured reflection coefficient, and the measurement presented on the display 56 would be essentially the same as in the absence of the fracture. This demonstrates a further feature of the invention wherein the orientation of a fracture in the conductive layer 22, even though invisible to a person testing the layer 22 can be determined by manual rotation of the probe 20 about its longitudinal axis.

Also, for purposes of calibration of the probe 20 prior to measurement tests of the layer 22, it is useful to provide a short-circuit connection between the conductive pads 38 and 40, by means to be described hereinafter, to present the analyzer 34 with a transmission-line termination having an impedance of essentially zero. The actual value of impedance, or reflection coefficient, measured by the analyzer 34 during the calibration process is stored and is representative of any intrinsic contributions to the termination provided by inductance of the leads 54 and 48, as well as any stray capacitance between the pads 38 and 40 across the gap 42, plus other contributions to the load impedance which may be provided intrinsically by the construction of the probe 20. The value of the reflection coefficient or termination impedance obtained during the calibration interval is subtracted subsequently from measurements obtained with the probe 20 so as to insure an accurate measurement by means of the probe 20.

The sensitivity of the probe 20 is increased by employing materials of relatively low dielectric constant. This objective is obtained by use of the aforementioned fibrous glass and epoxy construction of the base 36. The arrangement of the pads 38 and 40 wherein one is connected to the inner conductor 50 and the other connected to the outer conductor 44 constitutes a balun or unbalanced electrical connection of the load to the transmission line of the coaxial cable 32. It is noted also that, in FIG. 3, the distribution of the electric field lines is dependent on the presence of any electrically conductive material which may be in the vicinity of the probe head 28. Accordingly, as will be described hereinafter, all portions of the probe 20, other than the coaxial cable 32, are constructed of a plastic, electrically-non conductive, material. The presence of an outer cap 58 (FIG. 1) of the head 28 in conjunction with the tubular construction of the handle 30 constitute a housing 60 which serves to keep the region of measurement free of foreign electrically conductive matter, including the hand of a person conducting the test.

Figure 5:
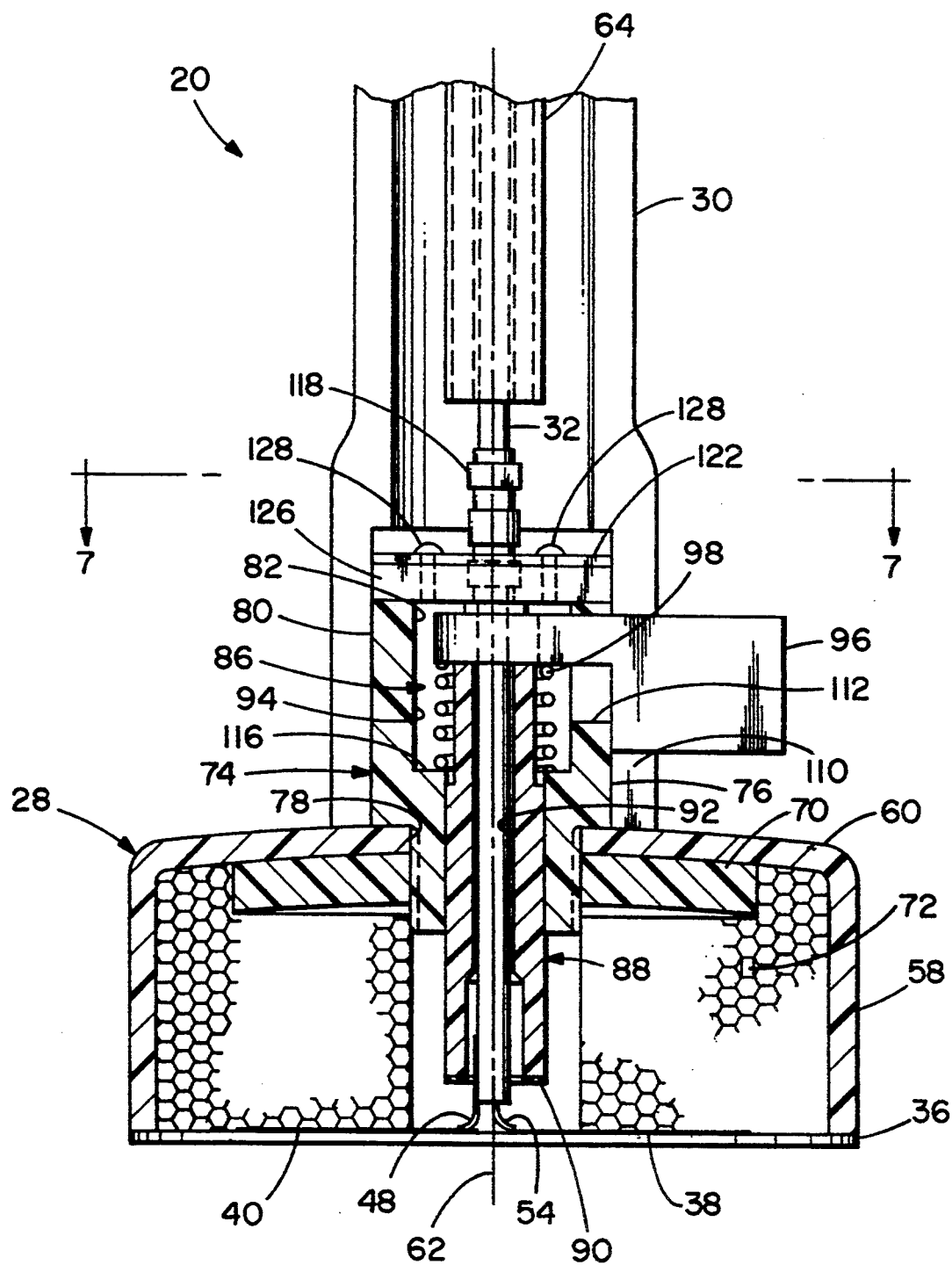
FIG. 5 is an enlarged portion of FIG. 4 showing details in construction of a head of the probe, the figure showing a plunger in an elevated position.
Figure 6:
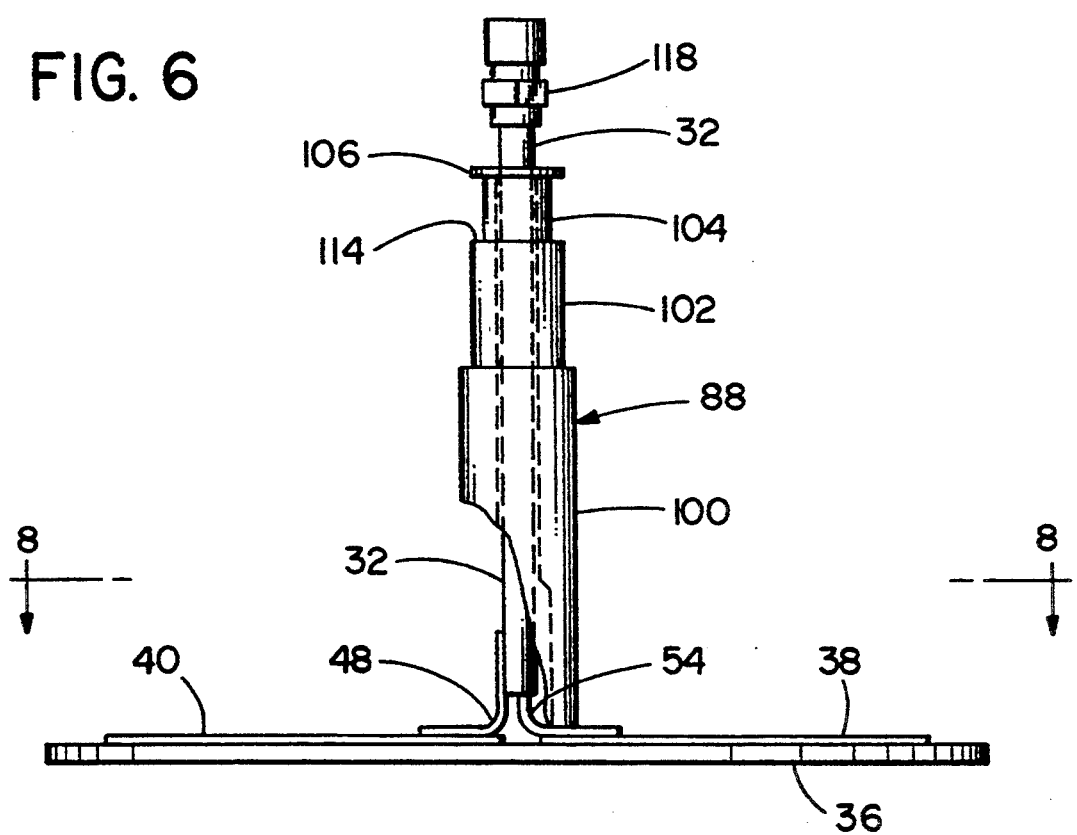
FIG. 6 is a side view of an inner portion of the head of the probe, including the plunger shown in a depressed position.
Figure 7:
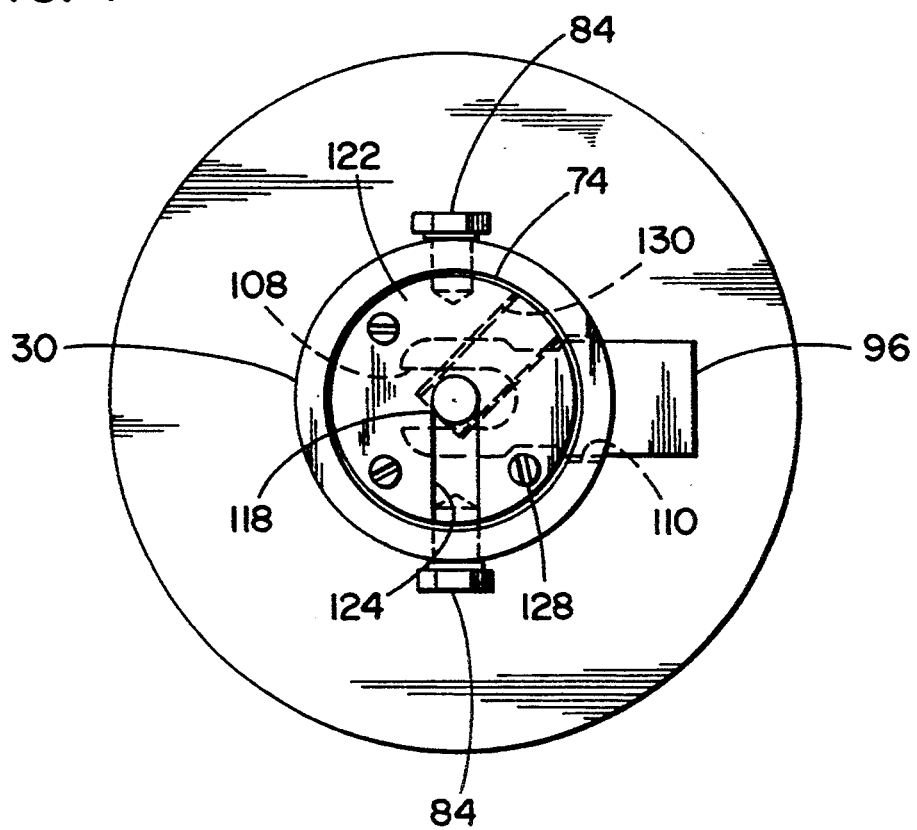
FIG. 7 is a transverse sectional view, partly diagrammatic, of the probe taken along the line 7—7 in FIG. 5.

FIGS. 4–8 show further details in the construction of the probe 20. The housing 60 is disposed symmetrically about a central longitudinal axis 62 of the probe 20, and the cable 32 is positioned on the axis 62. While other forms of transmission lines, such as a twisted pair of conductors enclosed within an electrically conductive shield (not shown), may be employed for communication of signals between the analyzer 34 and the pads 38 and 40, the coaxial cable 32 is employed in the preferred embodiment of the invention to isolate the electrical operation of the probe 20 from interference from outside signals which may be present in the vicinity of the probe 20. Further isolation between the outside environment, the test signal and the reflected signal is provided by a series of ferrite beads 64 arranged along the axis 62 and encircling the outer jacket 46 of the cable 32. The distal end of the cable 32, opposite the head 28 passes through a central bore 66 of a plug 68 disposed in the distal end of the handle 30 (FIG. 4), the plug 68 serving to secure and position the cable 32 within the handle 30. In the head 28, the cap 58 is strengthened by a disk 70 positioned within the cap 58 contiguous to the top portion thereof. The interior void Of the cap 58 is filled with a plastic foam 72 which serves as an antistatic agent. The lower rim of the cap 58 is secured to the periphery of the base 36 via an adhesive, though another form of securing, such as a snap-in arrangement (not shown), may be employed if desired. The probe 20 also includes a frame 74 which has a generally tubular shape, is mounted coaxially to the housing 60, has a lower portion 76 of reduced diameter which fits within a central opening 78 of the cap 58, and has an upper portion 80 of larger diameter which extends into the handle 30. The frame 74 is secured to the cap 58, as by means of an adhesive. The frame 74 has a central bore 82 which surrounds the cable 32. The frame 74 is secured to the handle 30 by means of screws 84 (FIG. 7).

In accordance with yet another feature of the invention, a calibration device 86 is included within the housing 60, and comprises a plunger 88 carrying a shorting disk 90 at the bottom of the plunger 88. The plunger 88 is fabricated of a plastic material of relatively low dielectric constant, less than 1.4 by way of example, the plastic material being electrically insulating. The shorting disk 90 is fabricated of an electrically conducting material, such as copper. The plunger 88 has a central bore 92 and encircles the lower end of the cable 32. The cable 32 passes through the central bore 92 with sufficient clearance space to allow the plunger 88 to translate relative to the cable 32 along the axis 62. The central bore 82 of the frame 74 has a sufficiently large diameter to encircle also the plunger 88 with clearance space to allow for the foregoing translation of the plunger 88 in the vertical direction The term "vertical", as well as the terms "top" and "bottom" are used as a matter of convenience in describing the probe 20 with reference to FIG. 1, it being understood that the probe 20 may be used also in some other orientation as for the measurement of the electrical characteristics of a conductive layer 22 oriented in a vertical direction, in which case the axis 62 would be horizontal.

In operation, the plunger 88 is depressed to bring the shorting disk 90 into contact with the inner edges of the pads 38 and 40 along the gap 42, thereby providing a direct electrical connection between the two pads 38 and 40 to provide a short-circuit termination of the cable 32. Upon elevation of the plunger 88 away from the pads 38 and 40, the short-circuit condition is terminated, and the probe 20 is ready to conduct electrical measurements. The momentary shorting of the pads 38 and 40 by the disk 90 serves to calibrate the probe 20 by providing a predetermined impedance to the signal analyzer 34.

During assembly of the probe 20, the cable 32 with the plunger 88 thereon extends through and beyond the cap 58 to allow for electrical connection of the leads 48 and 54 of the cable 32 to the pads 38 and 40. The connection may be made by soldering, after which the cable 32 with the base 36 and the pads 38 and 40 attached thereto are retracted back through the cap 58 until the peripheral portion of the base 36 makes contact with the cap 58. Upon completion of the assembly of the probe 20, the cable 32 with the series of beads 64 thereon is inserted into the relatively large opening 94 at the bottom of the handle 30, after which the aforementioned screws 84 are employed to secure the handle 30 to the frame 74.

Figure 4:
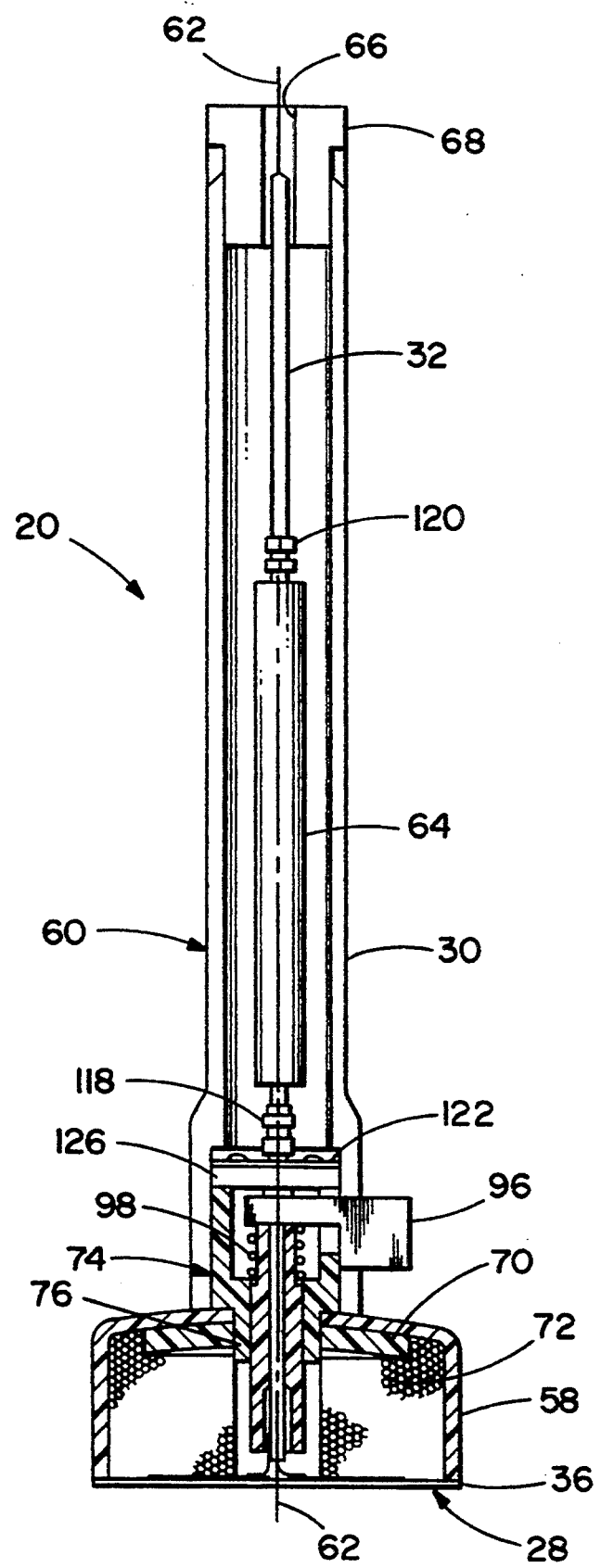
FIG. 4 shows a stylized longitudinal cross-sectional view of the probe taken along the central axis of the probe.

Manual operation of the plunger 88 is accomplished with the aid of a push button 96 secured to the plunger 88 with the aid of a spring 98 (FIGS. 4 and 5). As shown in FIG. 6, the plunger 88 comprises a lower section 100 of maximum diameter, a middle section 102 of reduced diameter, and an upper section 104 of still smaller diameter. The spring 98 has a generally circular cylindrical form with a diameter less than the diameter of the lower section 100, and encircles the middle section 102 of the plunger 88. A flange 106 is located at the top of plunger 88 and has a diameter larger than that of the upper section 104. The push button 96 has a longitudinal slot 108 (FIG. 7) which grips the upper section 104, and serves as a means of attachment of the push button 96 to the plunger 88 upon insertion of the push button 96 through a slot 110 (FIGS. 5 and 7) in the handle 30 and through an opening 112 (FIG. 5) in the frame 74.

In operation, the push button 96 is secured between the flange 106, and a shelf 114 (FIG. 6) at the interface between the sections 102 and 104 of the plunger 88. The plunger 88, the push button 96 and the spring 98, as well as the frame 74 are all fabricated of a plastic material which is electrically insulating and has a relatively low dielectric constant so as to be free of influence upon the measurement process. The spring 98, at its lower end, pushes against a shelf 116 (FIG. 5) in the central bore 82 of the frame 74, and at its upper end, exerts a spring force via the push button 96 against the flange 106 of the plunger 88. Thereby, the spring 98 urges the plunger 88 away from the pads 38 and 40. The slot 110 and the opening 112 are elongated in the direction of the central axis 62 to allow the push button 96 to translate up and down along the axis 62. Upon a manual depression of the push button 96 downwardly against a force of the spring 98, the push button 96 and the plunger 88 advance downwardly to bring the shorting disk 90 in contact with the pads 38 and 40. Upon release of the push button 96, the spring 98 is free to retract the plunger 88 away from the pads 38 and 40. The central bore 82 of the frame 74 has a larger diameter at the upper portion 80 of the frame 74 to provide clearance for the spring 98 and tire push button 96, the bore 82 becoming smaller in diameter by the shelf 116 to serve as a guide for the plunger 88 at the lower portion 76of the frame 74.

Figure 9:
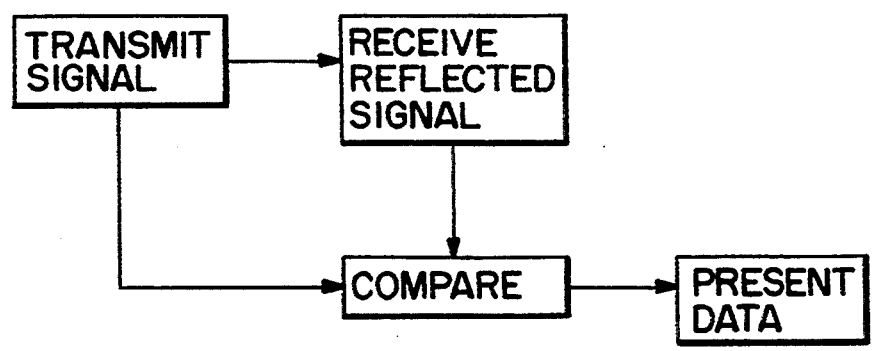
FIG. 9 is a block diagram showing operation of a signal analyzer of FIG. 1.

Operation of the analyzer 34 is shown in the block diagram of FIG. 9 wherein a signal is transmitted to the probe 20 followed by reception of a signal reflected back to the analyzer 34 from the probe 20. The two signals are compared, followed by a presentation of the data obtained from the comparison.

Construction of the probe 20 is facilitated by the use of a coaxial connector assembly 118 (FIGS. 4 and 5) located beneath the beads 64 and a coaxial assembly 120 located at the top of the assembly of beads 64 (FIG. 4) which divide the cable 32 into sections wherein one section is located within the series of beads 64, and another section is located within the plunger 88. The location of the cable 32 along the axis 62 is locked by means of a disk 122 (FIGS. 4, 5, and 7) having a slot 124 (FIG. 7) for receiving the connector assembly 118. The disk 122 is secured to a transverse section 126 of the frame 74 (FIGS. 4 and 5) by means of screws 128 (FIG. 7). The transverse section 126 has a slot 130 which is shown beneath a cutaway portion of the disk 122 in FIG. 7, the slot 130 serving to receive the connector assembly 118 during assembly of the probe 20. In a preferred embodiment of the invention, each of the pads 38 and 40 has a rectangular shape in which the length of a pad is two inches and the width of a pad is one inch. The gap 42 (FIG. 8) between the pads 38 and 40 has a width of 0.2 inches.

By virtue of the foregoing construction, the probe 20 is able to provide for both the functions of calibration and measurement of a covered electrically-conductive layer, in accordance with the invention, by capacitive coupling between the plates 38 and 40 to the electrically-conductive layer.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A probe for measurement of electrical characteristics of an electrically conductive material covered by a cover layer of nonconductive material, the probe consisting:
  a dielectric base;
  a pair of electrically conductive pads disposed on a top surface of said base in a common plane in parallel orientation relative to a surface of said electrically conductive material, said pads being separated from each other by a gap wherein, upon emplacement of the probe on the cover layer, said base lies between said pads and said cover layer;
  a housing upstanding from said base;
  a transmission line disposed within said housing, a first conductor of said transmission line connecting with a first one of said pads, a second one of said conductors of said transmission line connecting with a second of said pads, said transmission line providing electrical connection between said pads and a signal analyzer external to the probe; and wherein, upon energization of the probe with a test signal of the analyzer transmitted to said pads via said transmission line, there is a capacitive coupling of the test signal from said pads to the electrically conductive material resulting in a signal reflected by the pads back to the analyzer via said transmission line, the reflected signal being indicative of electrical characteristics of the electrically conductive material.

2. A probe according to claim 1 wherein said transmission line is a coaxial transmission line, said gap is a linear gap, and the electrically conductive material is configured as a layer of electrically conductive material.

3. A probe according to claim 2 further comprising calibration means disposed within said housing, said calibration means including a shorting element movable into a position of contact with both of said pads.

4. A probe according to claim 3 wherein said shorting element is configured as a plunger encircling said transmission line, the plunger including a push-button extending through said housing to permit manual movement of said plunger along a longitudinal axis of the probe.

5. A probe according to claim 4 wherein said calibration means includes an electrically nonconductive spring, disposed between a part of said housing and said push button, for urging said plunger away from said pads.

6. A probe for measurement of electrical characteristics of electrically conductive material covered by a cover layer of nonconductive material, the probe comprising:
  a pair of electrically conductive pads separated from each other by a gap, said pads extending in a common plane oriented parallel to a surface of said electrically conductive material;
  means for spacing said pads in insulating fashion from said cover layer;
  a transmission line having a first conductor connected to a first of said pads and a second conductor connected to a second of said pads, said transmission line providing electrical connection between said pads and a signal analyzer external to said probe; and
  wherein, upon energization of the probe with a test signal transmitted by the analyzer to said pads via said transmission line, there is a capacitive coupling of the test signal from the pads through the cover layer to the electrically conductive material, said pads reflecting the test signal back to the analyzer via said transmission line to provide data of electrical characteristics of the electrically conductive material.

7. A probe according to claim 6 wherein said spacing means comprises a dielectric base, said pads being disposed on a top surface of said dielectric base opposite from said cover layer.

8. A probe according to claim 7 wherein said transmission line is a coaxial transmission line, said first conductor is an inner conductor of said coaxial transmission line, and said second conductor is an outer conductor of said coaxial transmission line, and a terminal portion of said transmission line adjacent said pads is perpendicular to the plane of said pads.

9. A method for measuring electrical characteristics of an electrically conductive material covered by a cover layer of nonconductive material, the method comprising steps of:
  terminating a transmission line with a pair of coplanar electrically-conductive pads disposed in parallel orientation with a surface of said electrically conductive material, wherein a first of said pads connects with one conductor of said transmission line and a second of said pads connects with a second conductor of said transmission line; communicating a test signal via said transmission line to said pads;
  sliding said pads along a path parallel to said surface of said electrically conductive material and spaced apart from said surface; and
  comparing a signal reflected from said pads via said transmission line with said test signal to obtain data of said electrical characteristics.

10. A method according to claim 9 further comprising a step of spacing said pads in an insulating fashion from said cover layer.

11. A method according to claim 10 wherein said step of spacing is accomplished by mounting said pads upon a dielectric base.

12. A method according to claim 9 wherein, prior to said step of comparing, there is a step of calibrating a signal reflected from said pads by momentarily short circuiting said pads.

* * * * *